United States Patent [19]

Abe et al.

[11] 3,818,370

[45] June 18, 1974

[54] PHOTOSENSITIVE SOLID OSCILLATOR

[75] Inventors: Toshiro Abe, Katano; Keizi Kakite, Suita, both of Japan

[73] Assignee: Matsushita Electric Works, Ltd., Osaka, Japan

[22] Filed: Mar. 12, 1973

[21] Appl. No.: 340,100

Related U.S. Application Data

[63] Continuation of Ser. No. 142,913, May 13, 1971, abandoned.

[30] Foreign Application Priority Data

May 14, 1970 Japan .......................... 45-41418
May 15, 1970 Japan .......................... 45-41862

[52] U.S. Cl. ............... 331/66, 307/311, 317/235 N, 317/235 AA, 331/107 R, 331/108 R

[51] Int. Cl. ............................................ H03b 7/06

[58] Field of Search ...... 331/66, 107 R, 108 R, 111; 317/235 N, 235 T, 235 AA; 307/311

[56] References Cited

UNITED STATES PATENTS

| | | | |
|---|---|---|---|
| 3,422,323 | 1/1969 | Whoriskey | 317/235 AA X |
| 3,665,340 | 5/1972 | Kojima et al. | 331/107 R |

*Primary Examiner*—Herman Karl Saalbach
*Assistant Examiner*—Siegfried H. Grimm
*Attorney, Agent, or Firm*—Wolfe, Hubbard, Leydig, Voit & Osann, Ltd.

[57] ABSTRACT

A photosensitive solid oscillator which performs its oscillation when a light irradiation is provided substantially at the side of main electrodes. The oscillator comprises a wafer consisting of a semiconductor material, a lower impurity region of reverse conduction type to that of said semiconductor wafer and formed on the lower surface of the wafer, a first upper impurity region of reverse conduction type to that of the wafer and formed on part of the upper surface of the wafer, second upper impurity region of the same conduction type as the wafer and formed on the upper surface of said first upper impurity region, first and second ohmic main electrodes provided respectively on the surface of said second upper impurity region and on the exposed surface of the wafer, and a DC voltage source applied between said two main electrodes so that said voltage is in the reverse direction with respect to the junction between said wafer and said first upper region on the wafer.

12 Claims, 16 Drawing Figures

INVENTORS
TOSHIRO ABE
KEIZI KAKITE
BY
Wolfe, Hubbard, Leydig, Voit & Osann, Ltd.
ATTORNEYS INVENTORS
TOSHIRO ABE
KEIZI KAKITE
BY
Wolfe, Hubbard, Leydig, Voit & Osann, Ltd.
ATTORNEYS INVENTORS
TOSHIRO ABE
KEIZI KAKITE
BY
Wolfe, Hubbard, Leydig, Voit & Osann, Ltd.
ATTORNEYS INVENTORS
TOSHIRO ABE
KEIZI KAKITE
BY
Wolfe, Hubbard, Leydig, Voit & Osann, Ltd.
ATTORNEYS INVENTORS
TOSHIRO ABE
KEIZI KAKITE
BY
Wolfe, Hubbard, Leydig, Voit & Osann, Ltd.
ATTORNEYS

PHOTOSENSITIVE SOLID OSCILLATOR

This is a continuation of application Ser. No. 142,913, filed May 13, 1971 and now abandoned.

This invention relates to improvements in photosensitive solid oscillator.

The present inventors have previously proposed a photosensitive solid oscillator characterized in that a lower impurity region of a high impurity concentration is formed on one of the surfaces of a semiconductor wafer whose conductivity type is reverse to that of said lower impurity region, an upper impurity region whose conduction type is the same as that of said lower impurity region is formed on part of the upper surface of said wafer, electrodes are disposed on said upper impurity region and wafer respectively, a voltage is applied to said electrodes so that such voltage is in the reverse direction with respect to the junction between said wafer and upper impurity region, and the frequency of the oscillation is modulated by light. A general object of the present invention is to provide an oscillator in which the frequency of oscillation can be controlled over a wide range, and a large oscillating output can be obtained.

Figures 1, 2, 6, 7, 8:
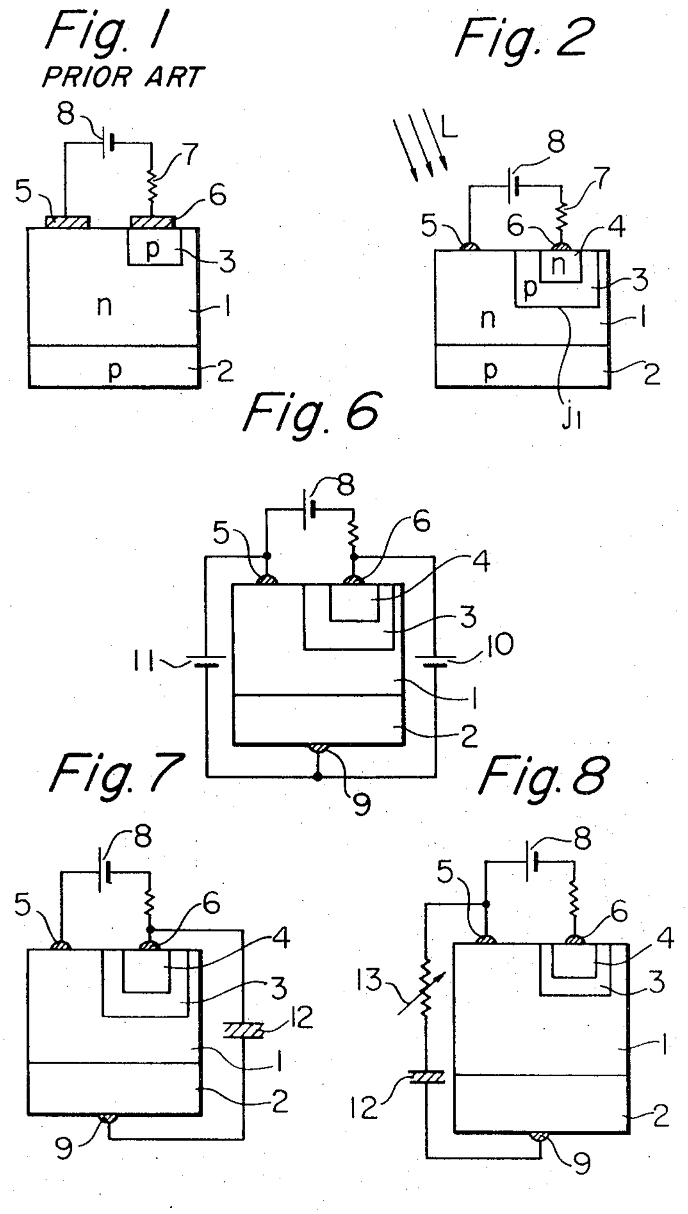
Fig. 1 PRIOR ART, Fig. 2, Fig. 6, Fig. 7, Fig. 8
Figure 3:
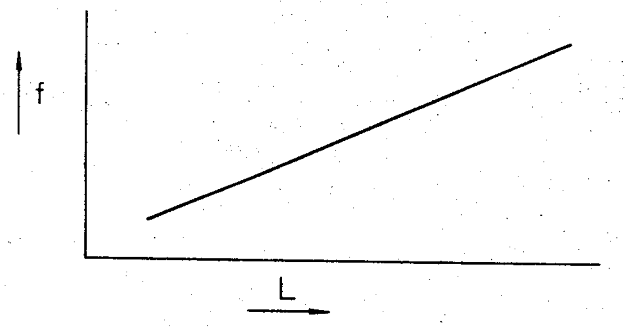
Figure 4:
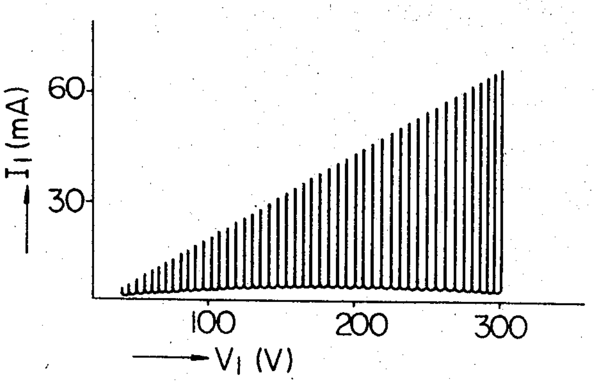
Figure 5:
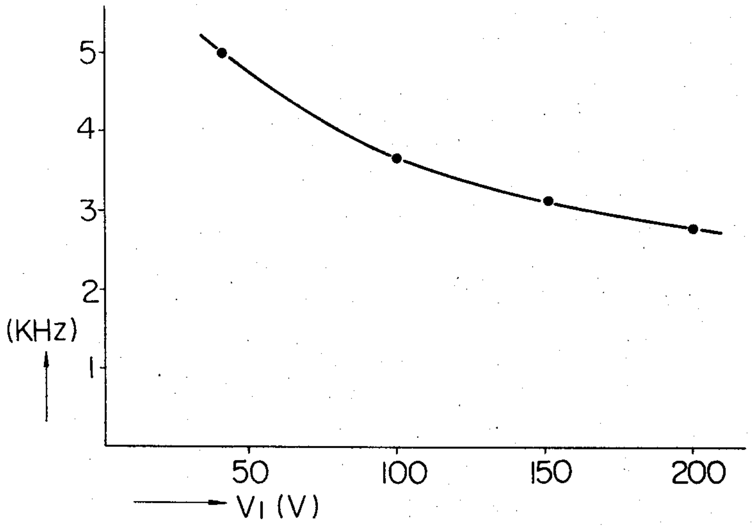

FIG. 1 shows the photosensitive solid oscillator previously proposed by the inventors, FIG. 2 shows an embodiment of a photosensitive solid oscillator according to the present invention, FIGS. 3 through 5 show characteristics of the solid oscillator according to the present invention, and FIGS. 6 through 16 show other embodiments of this invention, respectively.

Referring to FIG. 1, there is shown the structure of a known photosensitive solid oscillator, wherein 1 is an *n*-type semiconductor wafer, 2 is a *p*-type lower impurity region, 3 is a *p*-type upper impurity region, 5 and 6 are ohmic electrodes, 8 is a DC voltage source, and 7 is a resistance.

FIG. 2 illustrates an structure of the oscillator embodying this invention. In FIG. 2, a *p*-type lower impurity region 2 is formed on the lower surface of an *n*-type semiconductor wafer 1, a *p*-type first upper impurity region 3 is formed on a part of the upper surface of the wafer, an *n*-type second upper impurity region 4 is formed on the *p*-type first upper impurity region 3, first and second ohmic main electrodes 6 and 5 are provided on the respective surfaces of the *n*-type second upper impurity region 4 and the *n*-type wafer 1, respectively, and a main DC voltage source 8 is connected between the main electrodes 5 and 6 through an output resistance 7 so as to be in the reverse direction with respect to the junction $j_1$ between the *p*-type first upper impurity region 3 and the *n*-type semiconductor wafer 1.

This oscillator of the structure of FIG. 2 is operated in the following manner. When the voltage of the main DC source 8 is increased to a certain definite value, the oscillator starts its oscillation to present an oscillating voltage $V_o$ across the output resistance 7. This oscillation does not entirely depend on the oscillation starting voltage because, before the voltage of the main DC source 8 reaches the voltage E, oscillation starts when a light L is irradiated on the side including the electrode 6 of the oscillator due to a change of the internal constant of the oscillator caused by the light L. If the light amount is varied at this time, the oscillation frequency f varies depending on the light amount L, as shown in FIG. 3.

More detailed descriptions of such oscillating phenomenon will be given below referring to the V-I characteristic (FIG. 4) of the oscillator according to the present invention. The junction $j_1$ between the p-type first upper impurity region 3 and *n*-type semiconductor wafer 1 will be a reverse junction with respect to a DC voltage having a polarity as shown in FIG. 2. When a constant light amount L is applied to the element along with a DC voltage of the polarity shown in FIG. 2, the junction $j_1$ repeats rapidly the conducting and nonconducting states, whereby, in the element, a region conducting the current $I_1$ which is determined by the DC source 8 and output resistance 7, and another region not conducting the current $I_1$ and thus supporting almost all the source voltage $V_1$ become present. The relationship between the source voltage $V_1$ and the current $I_1$ flowing in the element is represented by the V-I characteristic shown in FIG. 4. Thus, according to the invention, an ideal oscillating characteristic is obtained under the foregoing condition.

An example of the oscillator according to the present invention will be disclosed below. Boron is diffused into one of the surfaces and into a part of the other surface of an *n*-type wafer 1 with a specific resistance of about 40Ω cm up to a depth of about 10$\mu$ and a concentration of about $10^{17}/cm^3$, so that a *p*-type lower impurity region 2 and a *p*-type first upper impurity region 3 are formed. Phosphorus is further diffused into the surface of the *p*-type first upper impurity region 3 to a depth of about 6$\mu$ and a concentration of about $10^{20}/cm^3$, whereby an n-type second upper impurity region 4 is formed. Nickel electrodes 5 and 6 are then provided on the surfaces of the *n*-type second upper impurity region 4 and the wafer 1, respectively, so as to provide the main ohmic electrodes. A DC voltage of 50V is applied via an output resistor 7 of 4$k\Omega$ between these main electrodes 5 and 6 of the photosensitive solid oscillator. The oscillating frequency *f* of the oscillating voltage obtained across the output resistor 7 is varied over a wide range from 1KHz to 100KHz depending on the amount of light irradiated on the element, and the amplitude of the oscillating output voltage obtained thereby is as high as about 48V. This oscillator element has such property that the oscillating frequency *f* varys depending on the magnitude of the source voltage $V_1$ applied to the element. That is, as the source voltage $V_1$ is varied while keeping the light amount L at a certain fixed value, the oscillating frequency f will become lower with a higher main DC source voltage $V_1$, as shown in FIG. 5. On the other hand, such oscillation that the applied voltage $V_1$ is oscillated over a wide range from 1 to 300V as shown in FIG. 4 can be performed, when the light amount L is kept at another fixed value.

As described above, the oscillator of this invention starts its oscillation with an applied source voltage higher than a certain definite voltage. When the source voltage is further increased, the oscillating frequency is lowered. The oscillator starts the oscillation also when a light is irradiated on the area near the main electrode even with a lower voltage and without increasing the source voltage as high as said oscillation starting voltage, and it is possible to obtain such a characteristic that the oscillating frequency is made higher as the light amount applied is increased. According to the invention, further, the oscillation starting voltage can be lowered to 1 volt, depending on the light amount, and the oscillating frequency of the oscillating voltage to be controlled by the DC voltage or by the light can be varied over a wide range from one to several hundred kilohertz. Furthermore, since the oscillation is performed due to the fact that the internal impedance of the oscillator element is varied from almost infinite value in its current blocking state to almost zero in its conducting state, a large oscillating output can be derived from the oscillator.

FIG. 6 shows another embodiment of this invention. According to this embodiment, an ohmic auxiliary electrode 9 is provided on the *p*-type lower impurity region 2, and an auxiliary DC source 10 is connected between the first main electrode 6 and the auxiliary electrode 9, and another auxiliary DC source 11 is inserted between the second main electrode 5 and the auxiliary electrode 9. In this arrangement, the oscillating frequency can be arbitrarily varied by varying the voltage of the auxiliary DC source, namely by varying the bias voltage. Also by the auxiliary DC source, the oscillator is capable of performing the oscillation at a low oscillation starting voltage even under the condition that the light intensity is small. In other words, the sensitivity of the element to light can be made higher.

FIG. 7 illustrates another embodiment of this invention, wherein a capacitor 12 is connected between the auxiliary electrode 9 and the first main electrode 6. The oscillating frequency can be controlled by varying the capacity of this capacitor. Namely, the oscillating frequency is lowered with an increase in the capacity of the capacitor or made higher with a decrease in the capacity of the capacitor.

Another embodiment is shown in FIG. 8, wherein a resistor 13 and a capacitor 12 are connected in series between the auxiliary electrode 9 and the second main electrode 5. The oscillating frequency can be varied by varying the capacity of the capacitor and the resistance of the resistor. The oscillating frequency is lowered with an increase in the capacity of the capacitor or increased with decrease in the capacity thereof. Also, the oscillating frequency is made higher by increasing the resistance of the resistor or decreased by decreasing the resistance value thereof.

Figure 9:
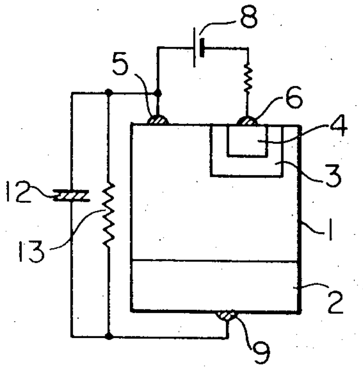

Another embodiment of the invention is shown in FIG. 9, wherein a capacitor 12 and a resistor 13 are connected in parallel to each other between the auxiliary electrode 9 and the second main electrode 5. The oscillating frequency is lowered with an increase in the capacity of the capacitor or made higher with a decrease in the capacity thereof. Also, the oscillating frequency is lowered with an increase in the resistor value of the resistance or made higher with a decrease in the resistance value.

Figure 10:
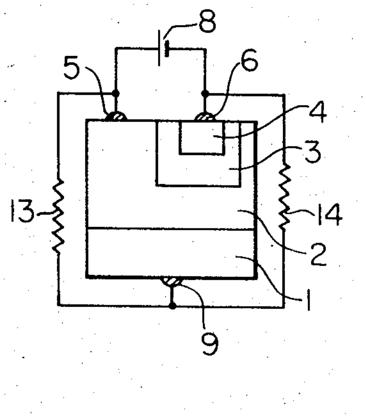

Another embodiment of the invention is shown in FIG. 10, wherein a resistance 14 is connected between the auxiliary electrode 9 and the first main electrode 6, and a further resistance 13 is connected between the auxiliary electrode 9 and the second main electrode 5. In this embodiment, the oscillating frequency is made higher with decrease in the resistance value of the resistances or lowered with an increase in the resistance value.

Figure 11:
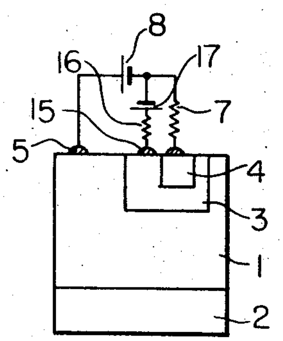

Another embodiment of the invention is shown in FIG. 11, wherein an ohmic control electrode 15 is provided on the *p*-type first upper impurity region 3, a resistance 16 and a DC source 17 are connected in series between the control electrode 15 and connecting point of the resistance 7 to the DC source 8, and the voltage from the DC source 17 is applied in forward bias to the junction between the p-type first upper impurity region 3 and n-type second upper impurity region 4. In this embodiment of FIG. 11, the addition of said resistance 16 results in the lowering of the light intensity required for starting the oscillation at the time when the voltage from the main source 8 is kept at a constant value, and after the oscillation is once started the oscillating frequency can be made higher as the voltage from the DC source 17 is increased. Further, it is also possible to obtain the same effect in the case of varying the voltage of the DC source 17 by varying the value of the resistance 16. That is, as the value of the resistance 16 is decreased, the oscillating frequency becomes higher in the same manner as in the case of increasing the DC voltage of the source 17, the light intensity required for starting the oscillation is thereby lowered. With the provision of the DC source 17, as described above, it is enabled to optionally select the light intensity for the oscillation starting or, on the other hand, to obtain the oscillating frequency of any desired value under the constant light intensity.

Figure 12:
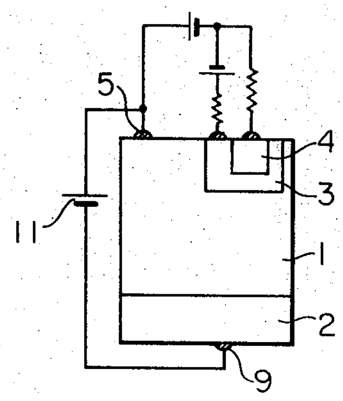

FIG. 12 shows another embodiment of the invention in accordance with the oscillator as in FIG. 11, wherein an ohmic auxiliary electrode 9 is provided on the p-type lower impurity region 2, and a bias voltage source 11 is additionally provided between the second electrode 5 and the auxiliary electrode 9. According to this arrangement, the oscillating frequency can be freely varied by varying the bias voltage, i.e., the voltage of the auxiliary DC source. Furthermore, the oscillation can be started with a lower light intensity, that is, the oscillation starting voltage upon light irradiation can be lowered, so that the sensitivity of the oscillator with respect to the light can be made higher.

Figure 13:
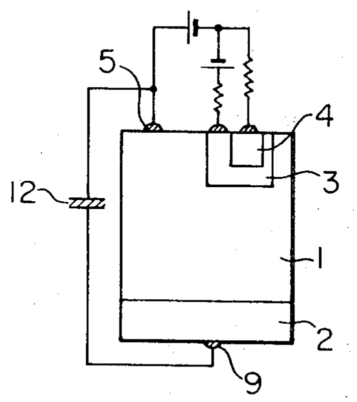

Another embodiment of the invention is shown in FIG. 13, wherein a capacitor 12 is connected between the auxiliary electrode 9 and the second main electrode 5. The oscillating frequency can be controlled by varying the capacity of the capacitor 12. Namely, the oscillating frequency is lowered with an increase in the capacity of the capacitor, or made higher with a decrease in the capacity of the capacitor.

Figure 14:
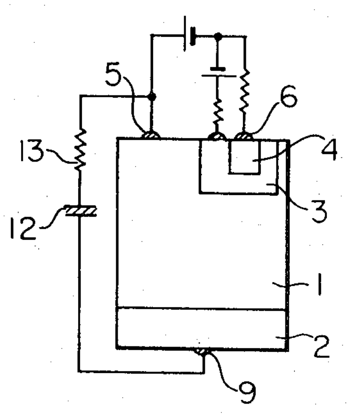

Another embodiment of the invention is shown in FIG. 14, wherein a resistance 13 and a capacitor 12 are connected in series between the auxiliary electrode 9 and the second main electrode 5. In this embodiment, it is possible that the oscillating frequency is controlled by varying the values of the capacitor and resistor. That is, the oscillating frequency is lowered with an increase in the capacity value, or made higher with a decrease in the capacity. Also, the oscillating frequency is made higher with an increase in the resistance value, or lowered with a decrease in the resistance value.

Figure 15:
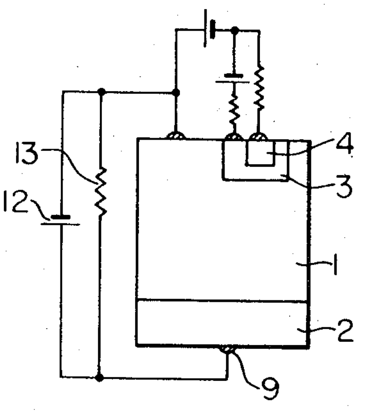

FIG. 15 shows another embodiment of the invention, wherein a capacitor 12 and a resistor 13 are connected in parallel with each other between the auxiliary electrode 9 and the second main electrode 5. Thus the oscillating frequency is lowered by increasing the capacity of the capacitor or made higher by decreasing it. Also, the oscillating frequency is lowered by increasing the resistance of the resistor or made higher by decreasing it.

Figure 16:
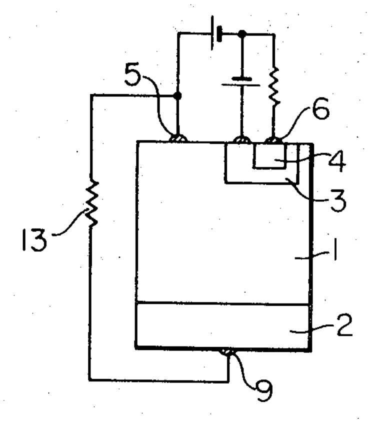

FIG. 16 shows another embodiment of the invention, wherein a resistance 13 is connected between the auxiliary electrode 9 and the second main electrode 5. According to this embodiment, the oscillating frequency is made higher with decreases in the resistance value, or lowered with an increase in the resistance thereof.

In the respective embodiments of FIGS. 8, 9, 12, 13, 14 and 15, the capacitor, resistance, DC source and others connected between the auxiliary electrode and the second main electrode may be connected between the auxiliary electrode and the first main electrode. The same alternative can be applicable to the case of FIG. 7.

In the foregoing embodiments, *n*-type semiconductor regions may be used instead of *p*-type semiconductor regions, or *p*-type semiconductor regions may be replaced with *n*-type semiconductor regions.

What is claimed is:

1. A photosensitive solid oscillator which performs its oscillation upon a light irradiation substantially at the side of main electrodes, which comprises a wafer consisting of a semiconductor material having a first type of conductivity selected from the group consisting of *n*-type conductivity and *p*-type conductivity; a first impurity region in said wafer having a conductivity type which is reverse to that of said wafer, said first impurity region being formed on one of the surfaces of said wafer; a second impurity region in said wafer having a conductivity type which is reverse to that of said wafer, said second impurity region being formed on a part of a second surface of said wafer, a third impurity region having the same conductivity type as said wafer and formed on a part of the surface of said second impurity region; an ohmic first main electrode provided on the surface of said third impurity region; an ohmic second main electrode provided on a surface of said wafer; and a DC voltage source applied between said two main electrodes so that said voltage is in the reverse direction with respect to the junction between said wafer and said second impurity region.

2. An oscillator according to claim 1 which further comprises an ohmic auxiliary electrode provided on said first impurity region and a bias voltage applied between said auxiliary electrode and at least one of said main electrodes.

3. An oscillator according to claim 1, wherein an ohmic auxiliary electrode is provided on said first impurity region and a capacitor is connected between said auxiliary electrode and one of said main electrodes.

4. An oscillator according to claim 1, wherein an ohmic auxiliary electrode is provided on said first impurity region and a capacitor and a resistance are connected in series between said auxiliary electrode and one of said main electrodes.

5. An oscillator according to claim 1, wherein an ohmic auxiliary electrode is provided on said first impurity region and a capacitor and a resistance are connected in parallel between said auxiliary electrode and one of said main electrodes.

6. An oscillator according to claim 1, wherein an ohmic auxiliary electrode is provided on said first impurity region and a first resistance is connected between said auxiliary electrode and the first main electrode and a second resistance is connected between said auxiliary electrode and the second main electrode.

7. An oscillator according to claim 1, wherein an ohmic control electrode is provided on said second impurity region, and a biasing DC voltage source is connected between said control electrode and said first main electrode, the voltage from said DC source being applied to the electrodes in the forward direction with respect to the junction between said second and third impurity regions.

8. An oscillator according to claim 7, wherein an ohmic auxiliary electrode is provided on said first impurity region and a bias voltage is applied between said auxiliary electrode and either one of said main electrodes.

9. An oscillator according to claim 7, wherein an ohmic auxiliary electrode is provided on said first impurity region and a capacitor is connected between said auxiliary electrode and one of said main electrodes.

10. An oscillator according to claim 7 wherein an ohmic auxiliary electrode is provided on said first impurity region and a capacitor and a resistance are connected in series between said auxiliary electrode and one of said main electrodes.

11. An oscillator according to claim 7, wherein an ohmic auxiliary electrode is provided on said first impurity region and a capacitor and a resistance are connected in parallel between said auxiliary electrode and one of said main electrodes.

12. An oscillator according to claim 7, wherein an ohmic auxiliary electrode is provided on said first impurity region and a resistance is connected between said auxiliary electrode and one of said main electrodes.

* * * * *